United States Patent
Knierim et al.

(10) Patent No.: US 11,372,025 B2
(45) Date of Patent: *Jun. 28, 2022

(54) SYSTEMS AND METHODS FOR SYNCHRONIZING MULTIPLE TEST AND MEASUREMENT INSTRUMENTS

(71) Applicant: Tektronix, Inc., Beaverton, OR (US)

(72) Inventors: Daniel G. Knierim, Beaverton, OR (US); Barton T. Hickman, Portland, OR (US); Joshua J. O'Brien, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/317,841

(22) Filed: May 11, 2021

(65) Prior Publication Data
US 2021/0263076 A1    Aug. 26, 2021

Related U.S. Application Data

(63) Continuation of application No. 16/788,176, filed on Feb. 11, 2020, now Pat. No. 11,002,764.
(Continued)

(51) Int. Cl.
*G01R 13/02* (2006.01)
*H03K 5/00* (2006.01)
(Continued)

(52) U.S. Cl.
CPC ..... *G01R 13/0254* (2013.01); *G01R 13/0263* (2013.01); *G01R 31/319* (2013.01);
(Continued)

(58) Field of Classification Search
CPC ...... G01R 13/0254; G01R 13/32; H03K 5/00; H03K 2005/00019; H03L 7/091; H03L 7/18; H03L 7/189
See application file for complete search history.

(56) References Cited

U.S. PATENT DOCUMENTS

| 7,240,231 B2 * | 7/2007 | Conway | G01R 19/2516 |
| | | | 713/401 |
| 8,542,005 B2 * | 9/2013 | Kharrati | G01R 13/0254 |
| | | | 324/121 R |

(Continued)

*Primary Examiner* — Patrick O Neill
(74) *Attorney, Agent, or Firm* — Miller Nash LLP; Andrew J. Harrington

(57) ABSTRACT

A system includes a plurality of oscilloscopes, each oscilloscope having an output port and an input port, a cable connecting the output port of an initial oscilloscope of the plurality of oscilloscopes to the input port of a second oscilloscope of the plurality of oscilloscopes, the initial oscilloscope having a processing element to generate a master run clock, the second oscilloscope having a processing element including a phase-locked loop to lock a slave run clock to the master run clock, wherein the processing element of one of the oscilloscopes executes code to cause the processing element to manipulate one of the run clocks to pass trigger information to another of the plurality of oscilloscopes. A method of synchronizing at least two oscilloscopes including a master oscilloscope and at least one slave oscilloscope includes connecting the at least two oscilloscopes together using output ports and input ports of the at least two oscilloscopes and at least one cable; sending a master run clock from the master oscilloscope to at least one slave oscilloscope; synchronizing a run clock of the at least one slave oscilloscope to the master run clock; recognizing a trigger event at a first oscilloscope of the at least two oscilloscopes; altering the run clock at the first oscilloscope to encode a trigger indication; and receiving the altered run clock at a second oscilloscope of the at least two oscilloscopes, wherein the trigger indication causes the second oscilloscope to recognize the trigger event.

20 Claims, 6 Drawing Sheets

Related U.S. Application Data

(60) Provisional application No. 62/804,678, filed on Feb. 12, 2019.

(51) Int. Cl.
   *H03L 7/08* (2006.01)
   *G01R 31/319* (2006.01)

(52) U.S. Cl.
   CPC ................. *H03K 5/00* (2013.01); *H03L 7/08* (2013.01); *H03K 2005/00019* (2013.01)

(56) References Cited

U.S. PATENT DOCUMENTS

| | | | | |
|---|---|---|---|---|
| 9,026,402 | B2* | 5/2015 | Delbue | H03L 7/00 |
| | | | | 702/189 |
| 9,651,579 | B2* | 5/2017 | Hickman | G01R 13/32 |
| 10,050,631 | B1* | 8/2018 | Schmidt | G01R 13/0254 |
| 11,002,764 | B2* | 5/2021 | Knierim | G01R 13/0263 |

* cited by examiner

US 11,372,025 B2

SYSTEMS AND METHODS FOR SYNCHRONIZING MULTIPLE TEST AND MEASUREMENT INSTRUMENTS

RELATED APPLICATIONS

This application is a continuation of, and claims priority to, U.S. patent application Ser. No. 16/788,176, filed Feb. 11, 2020, now U.S. Pat. No. 11,002,764, issued May 11, 2021, which is incorporated herein in its entirety.

FIELD

This disclosure relates to test and measurement instruments, such as an oscilloscope, and more particularly to systems and methods for synchronizing multiple test and measurement instruments.

BACKGROUND

Many oscilloscope users wish to acquire more channels synchronously than are available in a single oscilloscope. They need a way to synchronize the sampling clocks and triggers of multiple oscilloscopes. Prior multi-scope synchronization solutions offered by Tektronix include the TekLink® instrument interconnection interface, connectors, cables, hubs, and associated software (see, for example, https://www.tek.com/support/faqs/what-teklink); the dual oscilloscope synchronization product, DPOACQSYNC (see, for example, http://download.tek.com/manual/Dual-Oscilloscope-SynchronizationKit-Instructions.pdf); and the UltraSync™ oscilloscope synchronization architecture (see, for example, https://www.tek.com/dpo70000sx/scalable-system-precision-synchronization). However, the synchronization accuracy for the TekLink® interface may be too low for some users, and the cost and complexity of the DPOACQSYNC product and the UltraSync™ architecture may be too costly and complex for some users, especially in the mid-range.

Embodiments of the disclosed apparatus and methods address these issues.

DETAILED DESCRIPTION

In some situations, users may want more channels for data collection on a particular device under test (DUT) than are available on one oscilloscope. In these situations, being able to connect multiple oscilloscopes together to act as one oscilloscope with more channels allows users more channels. One should note that the term "oscilloscope" includes digitizers, waveform recorders, etc.

Embodiments of the presently disclosed technology, nicknamed "UltraSync™ Lite" or "USL," aim to provide synchronization accuracy that is acceptable for mid-range oscilloscopes, such as the Tektronix 5 Series MSO (mixed signal oscilloscope) oscilloscopes, at low cost and with simple user hook-up. The mid-range class of oscilloscopes generally have an "AUX Out" signal connector driven by a processing element. In one embodiment, the processing element may comprise a field-programmable gate array (FPGA). These oscilloscopes generally have an "AUX Trig In" signal connector and/or a "Ref In" signal connector driving the same processing element through a comparator. Regardless of the nature of the product, any oscilloscope that has an input port and an output port may employ the embodiments described here. If the input used is not internally 50Ω terminated, an external 50Ω BNC termination may have advantages.

Figure 1:
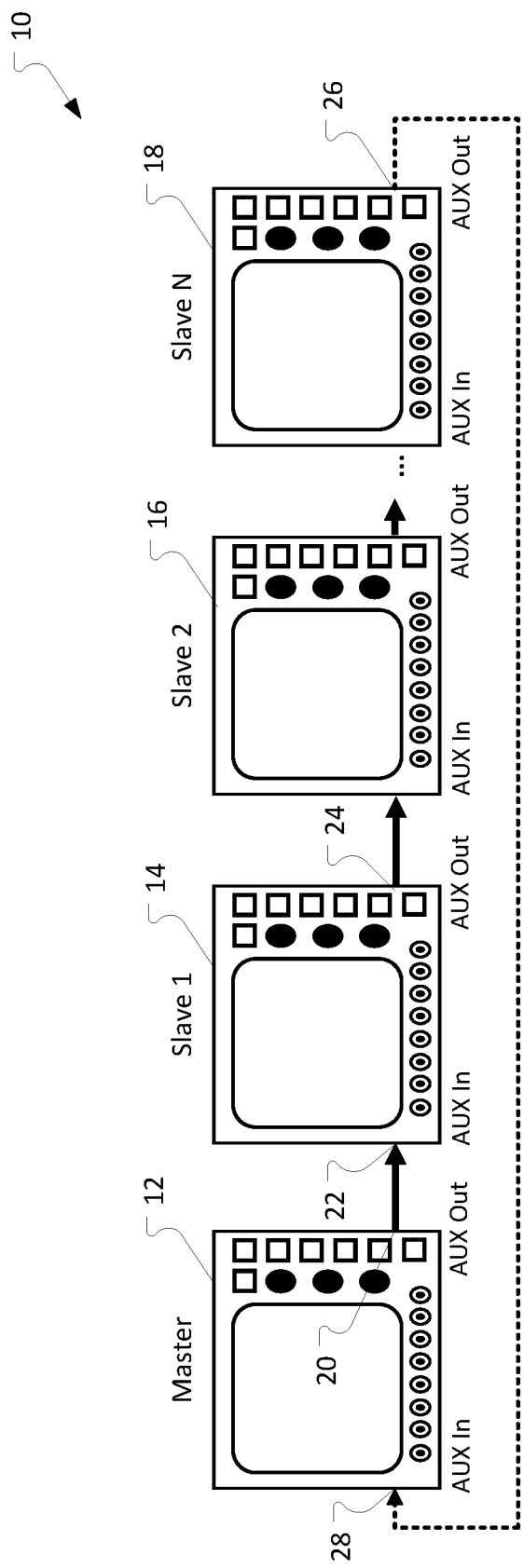
FIG. 1 shows a diagram of an embodiment of a system comprising multiple oscilloscopes.

As used here, the term "AUX In" below will refer to either of "AUX Trig In" or "REF In" as may be most convenient for implementation. In USL mode, the AUX Out port of a master oscilloscope would connect through a cable, such as a standard BNC (Bayonet Neill-Concelman) cable, to the AUX In port of the first slave oscilloscope. If more than two oscilloscopes are needed, AUX Out of the first slave would connect through another standard cable to AUX In of the next slave, and so on in a daisy-chain fashion, as illustrated in FIG. 1. The discussion here may refer to these standard cables as USL cables.

FIG. 1 shows a system 10 having multiple oscilloscopes 12, 14, 16 and 18. In this particular example, without limitation, an initial oscilloscope 12 acts at the master, generating a master run clock. The output port 20 of the oscilloscope 12 connects to the input port 22 of the oscilloscope 14, and the output port 24 of the oscilloscope 14 connects to the input port of oscilloscope 16. As discussed below, the output port 26 of the last oscilloscope 18 in the series may connect to the input port 28 of the initial/master oscilloscope 12. This may be referred to as a closed series, or closed loop, of oscilloscopes. Other oscilloscopes could be added to the series, but the start and end of the series occur at the same oscilloscope.

The embodiments here may involve two oscilloscopes, one of which will be referred to as the initial/master oscilloscope, where the initial oscilloscope generates a master run clock, to be discussed in more detail further. The embodiments here may also involve multiple oscilloscopes connected together in a series. The output of each oscilloscope connects to the input of the next oscilloscope in the series, with the output of the previous oscilloscope connecting to the input of the current oscilloscope. When the oscilloscopes connect in series, the second oscilloscope becomes the previous oscilloscope in the series.

The discussion here may refer to the last oscilloscope in the series as the final oscilloscope. In some embodiments, the output of the final oscilloscope may connect to the input of the initial oscilloscope. For embodiments using only two oscilloscopes, the second oscilloscope becomes the final oscilloscope. In embodiments having multiple oscilloscopes in which the final oscilloscope connects to the initial oscilloscope, i.e., in a closed series, any oscilloscope in the series can act as the initial oscilloscope and generate the master clock.

In USL mode, the master instrument would normally output from its AUX Out port a square wave or other periodic function signal having a predetermined frequency as a reference or master clock. Each slave instrument would lock its timebase to the reference clock received at its AUX In port, for example by using a phase-locked loop (PLL). The slave instrument will also pass the clock down the chain through its AUX Out port. The PLLs would be sensitive to a particular edge polarity, in one embodiment the rising edge of the reference clock. The oscilloscopes would likely be connected to the same network, such as Ethernet, Wi-Fi, etc., for data collection, but the network connection is not needed for synchronization. The connector to the network is shown in FIG. 2 as 62 for the master oscilloscope 12 and 162 for the slave oscilloscope, in this example, oscilloscope 14.

Figure 2:
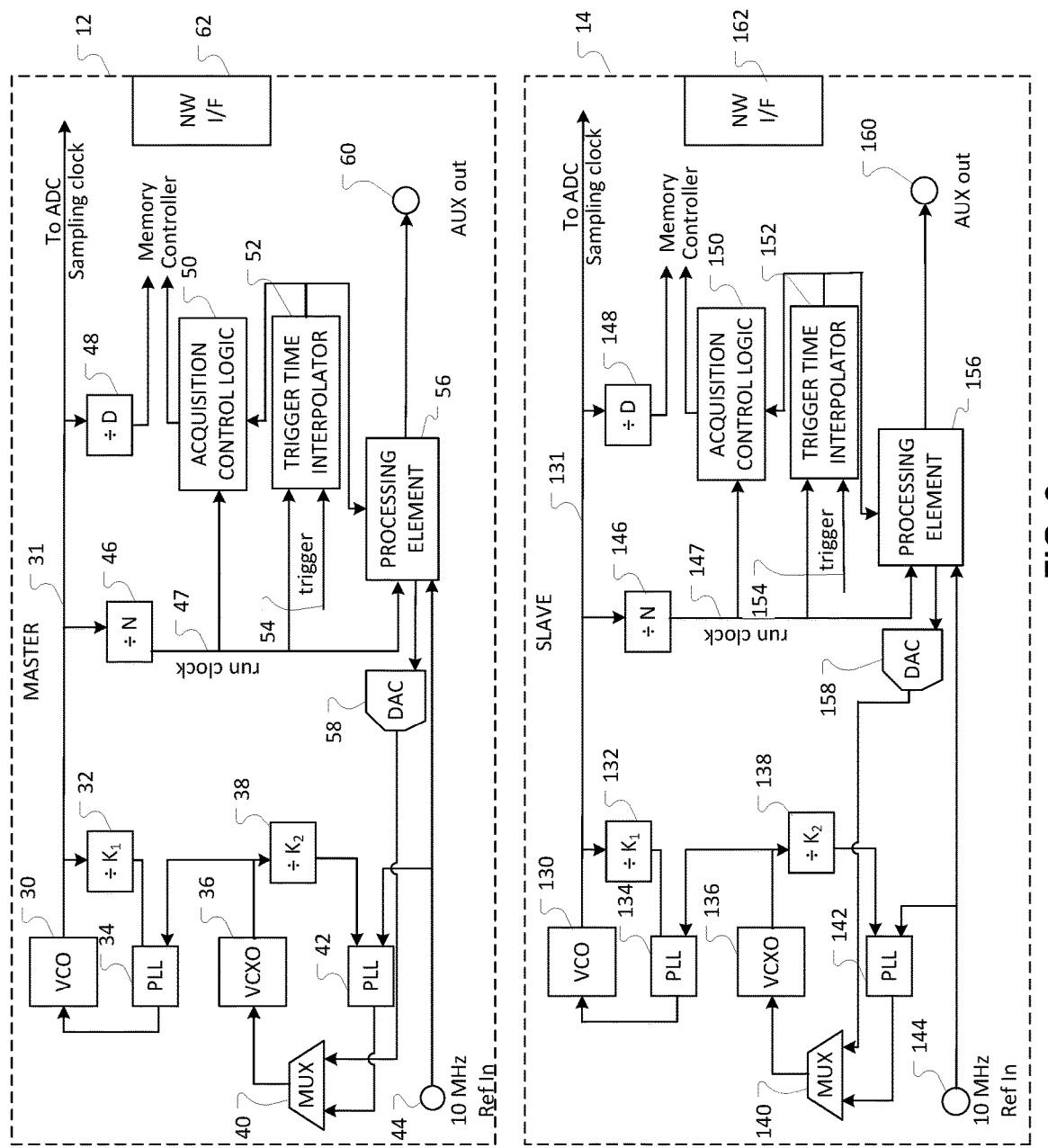
FIG. 2 shows a schematic of an embodiment of a portion of a system comprising multiple oscilloscopes.

In FIG. 2, a master oscilloscope 12 generates the run clock signal that passes to the slave oscilloscope 14. One should note that any oscilloscope other than 12 could be the slave. Each oscilloscope has the same components but operates differently in the series or daisy-chained configurations. A component in the master oscilloscope that has a reference number "xx" corresponds to an identical component in the slave oscilloscope having a reference number "1xx."

Master oscilloscope 12 has a voltage-controlled oscillator (VCO) 30 that generates a first output clock signal 31. This output clock signal is then divided by some factor $K_1$ at divider 32 and compared with the frequency of the VCXO 36. PLL 34 adjusts the control voltage of VCO 30 so as to lock the frequency of clock signal 31 to be exactly $K_1$ times the frequency of VCXO 36. If a reference clock, such as 10 MHz, is provided to input port 44, divider 38 and PLL 42 (through MUX 40) may be used in similar fashion to lock the frequency of VCXO 36 to be exactly $K_2$ times the frequency of the reference clock. Otherwise, the processing element 56 may provide a DC calibration voltage through DAC 58 and MUX 40 to set the frequency of VCXO 36 based on factory calibration data.

The output of the VCO 30 becomes the sampling clock 31 to analog-to-digital converter(s) used by the oscilloscope in acquiring data samples. However, the logic circuitry may operate better at a lower speed clock, so the divider 46 divides the sampling clock 31 down by a factor N to produce a divided sampling clock 47. The discussion here will refer to this clock as the 'run clock.' This run clock 47 becomes the master clock used to synchronize across all of the oscilloscopes in the series, e.g. in system 10. The run clock 47 will pass through a processing element 56 to the output port 60 and on to the other oscilloscopes via the USL cable(s). In one embodiment, the processing element comprises an FPGA and a portion of the divider N 46 and/or 146 may reside inside the FPGA. In this instance, the FPGA generates the run clock and distributes it to other blocks within the FPGA.

In an embodiment, for ease of understanding, the different dividers may have related values. For example, if one assumes that the VCO 30 has a clock of 6.25 GHz, the first divider 32 divides by 125, the resulting output equals 50 MHz, so the input to the PLL 34 is 50 MHz. The VCXO operates at 50 MHz, so the PLL 34 locks those two signals. Divider 38 divides the 50 MHz signal by 5, resulting in a 10 MHz signal into the PLL 42. The PLL then locks that signal with the input 10 MHz reference clock, if supplied.

Similarly, the divider 46 divides the 6.25 GHz clock by some factor that puts the clock at a speed appropriate for the logic circuitry. In this example, the factor N is 224, which brings the resulting run clock speed to around 27.9 MHz. The divider 48 divides the clock by a factor D which determines how often samples are stored. The sample clock continues to run and the oscilloscope continues to sample, but the user may not want to store every sample. This can lead to memory overruns, so the user can control how often the system stores samples using a control interface that controls the factor D of divider 48. One divider 48 may be shared by every channel in the oscilloscope, or multiple dividers 48 may be used, up to one per channel. The frequencies and divider values above are intended only for ease of understanding and no limitation to those divider values and frequencies is intended nor should any be implied.

Returning to FIG. 2, the trigger time interpolator 52 receives a trigger event 54. The acquisition control logic 50 receives a signal from the trigger time interpolator 52. The acquisition control logic stops the acquisition of samples into the memory and produces a time stamp of the trigger event relative to the run clock, generally with resolution finer than the period of the run clock 47 and sample clock 31. It also operates to reset the divider/decimator 48 in each channel.

In the current embodiment, the run clock 47 passes to the next oscilloscope in the series out the output port 60 to become a reference clock on the input port, e.g. 144, of the next oscilloscope. The run clock signal may pass through the fabric of the FPGA that implements a digital PLL.

In previous multi-oscilloscope configurations, timebases might be locked by supplying the same 10 MHz reference clock to all oscilloscopes' Ref In ports (for example 44 & 144) and configuring the dividers and PLLs in the same fashion. While this technique provides for the sampling clock 131 to have the same frequency and phase as the master sampling clock 31, the run clock 147 in the slave would have the same frequency but an arbitrary phase with regard to the run clock 47 of the master. As the run clocks control the resetting of the decimation dividers, decimated sample clocks would also have the same frequency but arbitrary phase between the master and slave. This causes problems in data acquisition and ensuring all the channels across all the oscilloscopes act like channels in a single oscilloscope with a single run clock.

In the current embodiments, slave VCO 130 is phase-locked to the slave VCXO 136 in the standard manner, but a digital PLL is implemented in processing element 156 which compares slave run clock 147 to the master run clock 47 as received at Aux In port 144. The digital PLL then controls VCXO 136 (and in turn VCO 130) through DAC 158 and MUX 140 to lock the master and slave run clocks. This insures the slave run clock 147 has the same frequency and phase as the master run clock 47, which in turn allows slave acquisition control logic 150 to act as an extension of master control logic 50, resetting decimation dividers and starting and stopping acquisitions in synchrony. In an embodiment, the master oscilloscope communicates acquisition control, trigger event, and associated time stamp messages through the run clock manipulations discussed below. In another embodiment, the master oscilloscope provides the master run clock, but another oscilloscope may communicate the trigger event and associated time stamp.

Figure 3:
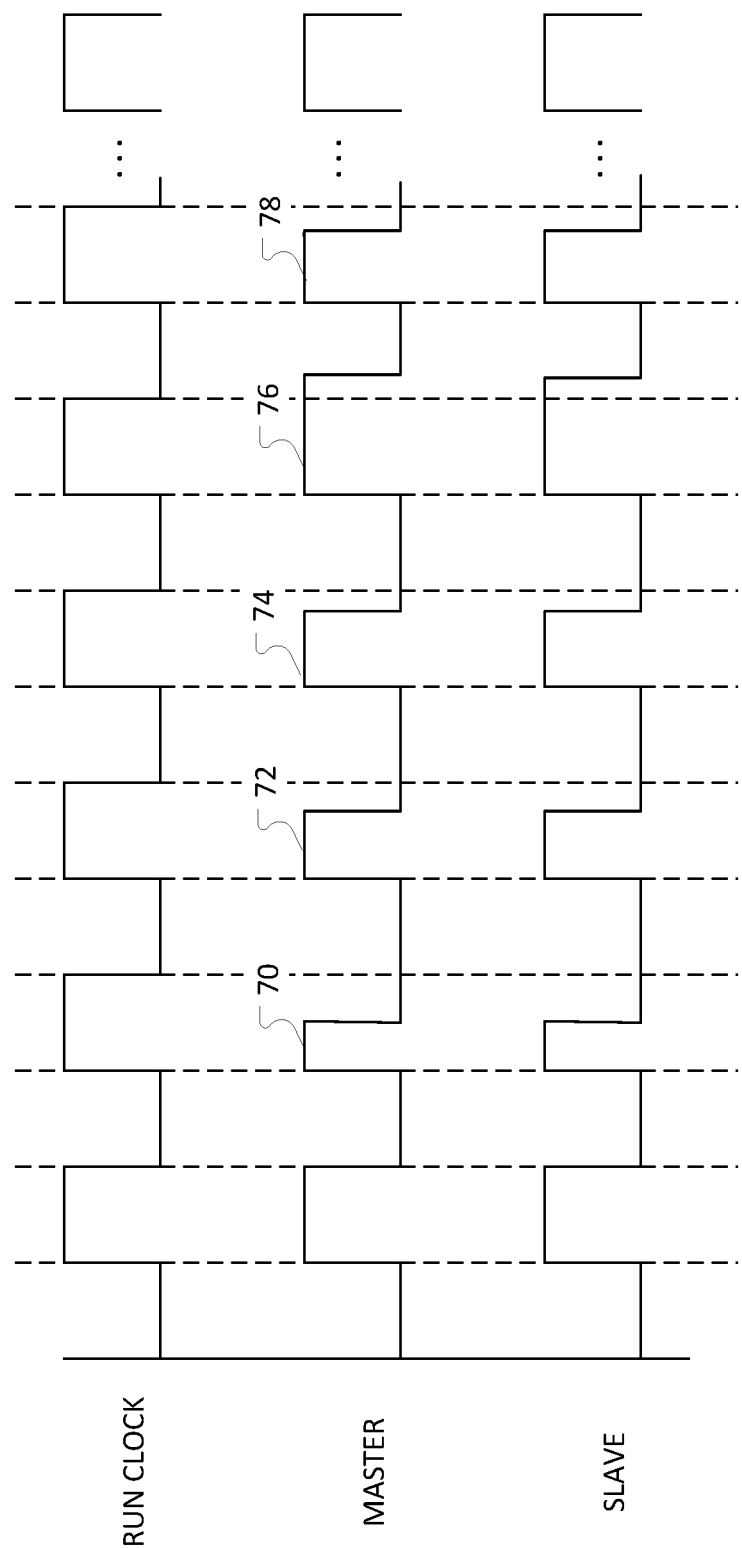
FIG. 3 shows an embodiment of a timing diagram between a master and at least one slave oscilloscope.

FIG. 3 shows an embodiment of a timing diagram showing one embodiment of a series of pulses. In FIG. 3, the top line shows a periodic square wave, without limitation, but could be any periodic function. When the master oscilloscope recognizes a trigger event defined across any number of its input channels, it would synchronize the trigger to the run clock cycle and timestamp the location of the trigger within the run clock cycle. On the next subsequent run clock cycle, the master would shift the duty cycle of its output, leaving the rising edge at its regular position but advancing the falling edge to produce a pulse having a duty cycle less than 50%, for example, a 25% duty cycle pulse, shown on the MASTER line at pulse 70.

The first slave would recognize the first 25% duty cycle pulse as the trigger event to stop acquisitions, after an appropriate post-trigger count, and then use the digital timestamp from the master to place the trigger point in the record. It would also pass the same shifted falling edges to the next slave in the chain, so the next slave can also trigger. The size of the circular buffer used to capture acquisitions would be increased to account for the maximum additional trigger latency down the USL series of instruments.

The system would then alter the next pulses from the master clock to encode the trigger time stamp. This could occur in multiple ways, but in one example, when the falling edge of the clock signal occurs before the end of the regular period, it could encode a digital '1.' If the falling edge of the clock signal occurs after the end of the regular period, it could encode a digital '0.' In the example shown in FIG. 3, the pulse 72 represents a '1,' a pulse 74 represents a '1,' the pulse 76 represents a '0,' and pulse 78 represents a '1.' The sequence encoded then represents a data word of 1 1 0 1.

Thus, this type of encoding, by manipulating the run clock, allows the master device to transmit the time stamp of the trigger event to the slave devices. The number of bits of the time stamp determines the number of pulses used to encode the time stamp. One should note that the embodiments here use rising edges as the 'fixed' portion of the signal and the falling edge as the 'altered' edge for ease of discussion. However, embodiments could also use the falling edges as the fixed edge and the rising edge as the altered edge. No limitation to any particular polarity is intended nor should any be implied. Other encoding methods are also anticipated, e.g. pulse amplitude modulation could be used instead of pulse width modulation.

This synchronizes the timebases, within the jitter of each PLL, and synchronizes the triggers exactly, as only the master calculates the trigger position, which is replicated digitally and therefore exactly in all slaves. Because the trigger information is shared digitally, and the timebase PLL averages the timing jitter of thousands to millions of edges, depending on the ratio of reference frequency to loop bandwidth, the overall oscilloscope-to-oscilloscope trigger jitter can be much less than in a system passing trigger information as a single edge placement in continuous-time.

The embodiments described above assume a trigger source within the master. As mentioned above, if the AUX Out of the last slave is routed back to the AUX In of the master, as shown by the dotted line in FIG. 1, any scope in the chain could become the trigger source. This would cause it to recognize a trigger event, timestamp it, and pass it down the chain by modulating the placement of falling edges. However, the master could remain the frequency reference defining the rising-edge timing, so that trigger source selection would not affect the timebase frequency.

The PLL bandwidth could be set based on lab evaluation/characterization to minimize inter-oscilloscope jitter—low enough to filter out most jitter/crosstalk added to the run clock rising edges within the FPGAs and/or I/O drivers, but high enough to track close-in phase noise of the oscillators. Timebases with a VCXO could lock the VCO either directly to the incoming run clock or to the VCXO that is in turn locked to the incoming run clock, depending on which provided lower overall jitter between timebases. Preliminary analysis suggests one would lock the VCO to the VCXO as described above, which in turn locks to the incoming run clock.

Other acquisition control messages, such as "Run" to start a new acquisition, "Abort" to stop a running acquisition without triggering, "Auto-Discover" to determine the number of and accumulated delay to each slave down the daisy-chain, "Fast-Edge" to produce a fast edge in each channel for power-up channel de-skew, etc. may also be defined. For instance, if a trigger event message begins with a 25% duty cycle pulse as described above, other messages could begin with a 75% duty cycle pulse to distinguish themselves from a trigger event. If the output port of the last slave is routed back to the input port of the master, acquisition control queries such as "Acq-Ready?" could be added as well, so the master can query when all the slaves are ready to execute a "Run" command.

It is possible to pass addresses of the oscilloscopes in the series through the USL cable(s). These addresses could be IP addresses, if all of the oscilloscopes are connected to a network, MAC addresses, unique device serial numbers, etc. This may allow automatic discovery of the other devices in the chain, and the order in which they are connected.

It is possible long-term (>1 reference cycle) memory effects in the FPGAs, I/O drivers, and/or cables could subtly shift the timing of rising edges due to the modulation of falling edge timing. To minimize the frequency content of such shifts within the PLL loop bandwidth, the message encoding scheme could maintain an equal number of early and late falling edges within each message. As a simple example, each bit of a message could be represented by an early, late pair for a '1' bit or a late, early pair for a '0' bit.

Figure 4:
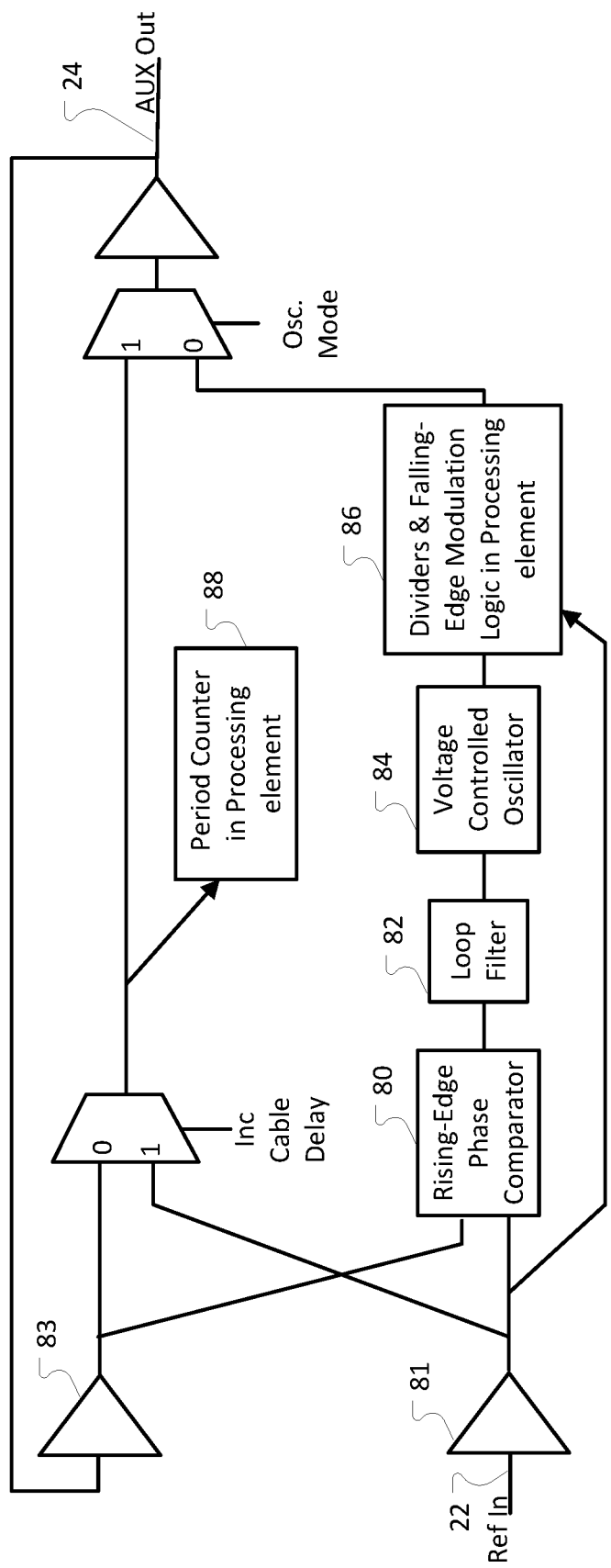
FIG. 4 shows a schematic of an embodiment of a zero-phase phase-locked loop architecture.

Although all the timebases are locked to the same frequency, there will be a phase difference due to the delay in the USL cable(s) and associated circuitry, which is not shown in FIG. 3. Cable delay is relatively stable, but active circuit delay may change with temperature. To minimize this effect, a "zero-phase" PLL architecture may be used, as shown in FIG. 4. In a zero-phase PLL, also referred to as a PLL with symmetric paths, the rising edges of the reference clock on the output port 24 are compared to the rising edges of the reference clock received at the input port 22 through symmetric circuitry. In one embodiment, the symmetric circuitry comprises matching buffers 81 and 83 and a rising-edge phase comparator 80. As long as the delays of the two symmetric paths track each other, the timing of the output reference clock will match the input, with no build-up of phase error down the series of devices. To the extent that the delays from the sample clock to the reference clock output within each oscilloscope track across the multiple oscilloscopes, the sample clocks will also track each other.

In one embodiment, the VCO 84 could consist of a VCO at 6.25 GHz phase-locked to a VCXO at 50 MHz. Tuning the control voltage input of the VCXO in turn controls the VCO clock frequency. One should note that different oscilloscopes in the series might have different oscillator frequencies and divider ratios.

Figure 5:
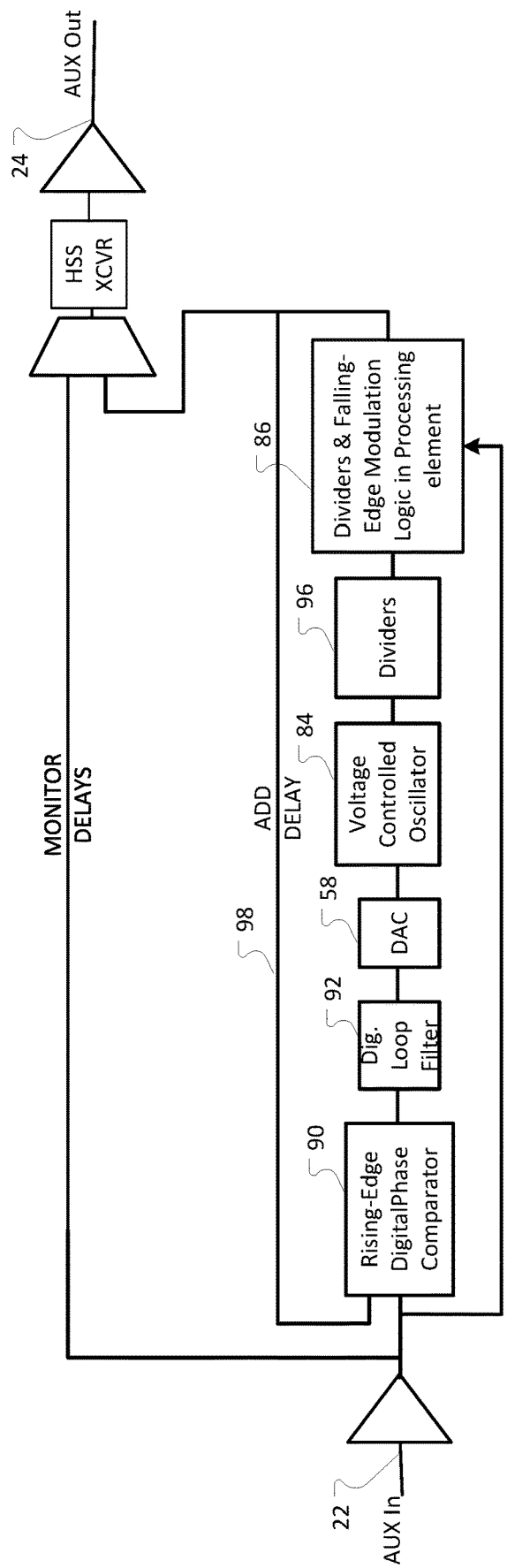
FIG. 5 shows a schematic of an embodiment of a backwards compatible, approximate zero-phase phase-locked loop architecture.

However, AUX Out feedback buffer 83 is not present in current oscilloscope hardware designs, referred to here as legacy hardware. USL could instead be implemented with no hardware cost or changes as shown in FIG. 5. This may come at some performance penalty as discussed below. One could implement the phase comparator 90 and loop filter 92 shown above digitally in the FPGA fabric and feed the loop filter output through I²C (Inter-Integrated Circuit) commands to the fine-tune DAC 158 and into the VCXO 136. Dividers 96 and potential further division within processing element 86 here represent run clock divider 146 in FIG. 2.

This would allow retrofit of oscilloscopes in a user's installed base for USL operation with a software update, but would impact performance in two ways. First, the AUX In and AUX Out buffers would be outside the zero-phase feedback loop so changes in I/O buffer delay vs temperature would not be inherently compensated. One could, however, characterize a nominal delay temperature coefficient and adjust the trigger time accordingly based on measured temperature. Alternatively, a nominally matching temperature-dependent delay could be inserted in the feedback path 98 within the FPGA fabric, thus approximating a zero-phase PLL.

The effective gain of a digital phase comparator depends on random jitter effects, so the jitter within the FPGA would need to be determined in order to set the phase comparator gain, and in turn the PLL loop bandwidth. This could be done for a representative sample in the lab, or implemented as part of factory calibration for each instrument produced.

The delay of the USL cable can be compensated, if known, by subtracting it from the digital trigger timestamp. As an aid to a customer setting up USL, one could provide a loop-back calibration procedure.

In one embodiment of the calibration procedure, a cable is connected from the output port to the input port of a device being added to the series. This forms a ring-oscillator through the FPGA, I/O drivers, and cable, and a first period is measured using period counter 88. Another ring-oscillator is then formed using the symmetric path of the "zero-phase" PLL to bypass the cable delay, and a second period is measured. The cable delay is determined by subtracting the two period measurements. The cable is then disconnected from the AUX Out of the new slave and connected to the AUX Out of the master or previous slave to create or extend the series or daisy-chain.

In another embodiment of the calibration procedure, the processing element could count the number of clock cycles of delay from outputting an edge on the AUX Out port to receiving the edge at the AUX In port through the USL cable. If a High-Speed Serial transceiver (HSS XCVR) is used for this measurement, the resolution of the cable delay measurement would be as fine as one Unit Interval (UI) of the HSS XCVR, typically less than 100 ps.

If cable delay change with temperature is significant, added circuitry in the master could track the total cable delay by comparing the phase of the clock on its input port at the end of the daisy-chain to the phase of the clock on its output port. Software could then apportion the change in total delay to individual cables based on the initial delay estimates of each cable. This would compensate for the cable delay versus temperature to the extent all cables are warming or cooling together.

Normal channel skew calibration by a user can be used to remove any residual timebase delay errors down the daisy-chain as well as any channel interconnect delay differences.

USL mode would not significantly affect normal acquisition modes. However, the time needed to communicate the trigger timestamp would likely impact FastFrame and FastAcq maximum trigger rate. Also, the extra circular acquisition buffer size would affect the maximum frame count for short FastFrame records.

Figure 6:
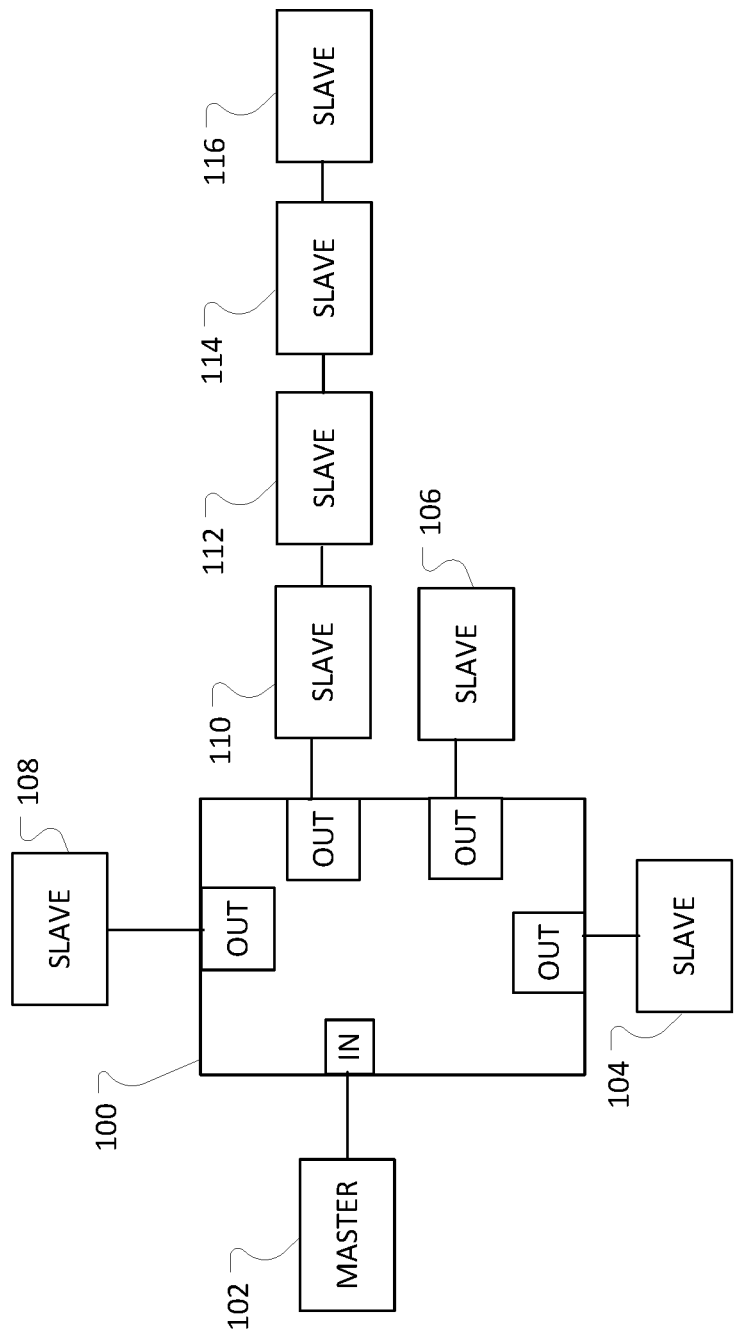
FIG. 6 shows a block diagram of a master/slave hub.

To minimize daisy-chain delay in large installations, embodiments include a USL "hub" as shown in FIG. 6. The hub 100 would broadcast the USL signal from a master 102 to multiple slaves in parallel in a "star" configuration, such as 104, 106, 108 and 110. A mixed star and daisy-chain installation would also work, such as a master driving a 1:4 hub, with the 4 outputs driving four daisy-chains. FIG. 6 shows an example in slave 110 also driving a chain of slaves 112, 114 and 116. To minimize the delay change versus temperature in the hub, the zero-phase PLL architecture described above could be used. Another alternative is to use active temperature control on a simple buffer architecture for the hub.

The hub could also provide a MUX function to connect the output ports of multiple slaves back to the input port of the master for relaying query results and/or a slave trigger event.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), Field Programmable Gate Arrays (FPGAs), and dedicated hardware controllers. One or more aspects of the disclosure may be embodied in computer-usable data and computer-executable instructions, such as in one or more program modules, executed by one or more computers (including monitoring modules), or other devices.

Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the disclosed technologies are provided below. An embodiment of the technologies may include one or more, and any combination of, the examples described below. Example 1 is a system, comprising: a plurality of oscilloscopes, each oscilloscope having an output port and an input port; a cable connecting the output port of an initial oscilloscope of the plurality of oscilloscopes to the input port of a second oscilloscope of the plurality of oscilloscopes; the initial oscilloscope having a processing element to generate a master run clock; the second oscilloscope having a processing element including a phase-locked loop to lock a slave run clock to the master run clock, wherein the processing element of one of the oscilloscopes executes code to cause the processing element to manipulate one of the run clocks to pass trigger information to another of the plurality of oscilloscopes.

Example 2 is the system of Example 1 wherein the plurality of oscilloscopes further comprises one or more additional oscilloscopes connected in a series with the initial oscilloscope and the second oscilloscope, each additional oscilloscope having a cable connecting the output port of a previous oscilloscope in the series to the input port of a current oscilloscope in the series, wherein the second oscilloscope is a previous oscilloscope in the series.

Example 3 is the system of either of Examples 1 and 2, wherein the plurality of oscilloscopes comprises a final oscilloscope having a cable connecting the output port of the final oscilloscope and the input port of the initial oscilloscope to form a closed loop through the plurality of oscilloscopes.

Example 4 is the system of any of Examples 1 through 3, wherein the system is implemented using legacy hardware.

Example 5 is the system of any of Examples 1 through 4, wherein the cable connecting the output port of the initial oscilloscope to the input port of one other of the plurality of oscilloscopes connects to the input port of the other oscilloscope through a hub.

Example 6 is the system of Example 5, wherein the hub has one input port and multiple output ports to connect to the input ports of multiple oscilloscopes.

Example 7 is the system of either Example 5 or Example 6, wherein the hub is connected to multiple oscilloscopes and at least one of the multiple oscilloscopes has a cable connected to an output port and connected to an input port of one other oscilloscopes that is not connected to the hub or any other oscilloscopes.

Example 8 is the system of any of the Examples 1 through 7, wherein each oscilloscope other than the initial oscilloscope has a phase-locked loop with symmetric paths.

Example 9 is the system of any of the Examples 1 through 8, wherein the phase-locked loop is implemented in the processing element.

Example 10 is a method of synchronizing at least two oscilloscopes including a master oscilloscope and a slave oscilloscope, comprising: connecting the at least two oscilloscopes together using output ports and input ports of the at least two oscilloscopes and at least one cable; sending a master run clock from the master oscilloscope to at least one slave oscilloscope; synchronizing a run clock of the at least one slave oscilloscope to the master run clock; recognizing a trigger event at a first oscilloscope of the at least two oscilloscopes; altering the run clock at a first oscilloscope to encode a trigger indication; and receiving the altered run clock at a second oscilloscope of the at least two oscilloscopes, wherein the trigger indication causes the second oscilloscope to recognize the trigger event.

Example 11 is the method of Example 10, wherein altering the run clock comprises encoding information to be sent between the oscilloscopes by altering the intervals between a first edge polarity of the run clock and a second edge polarity of the run clock.

Example 12 is the method of Example 11, wherein the encoding information comprises encoding at least one of a time stamp of the trigger event, and acquisition control messages Example 13 is the method of either Example 11 or Example 12, wherein the encoding information comprises encoding device addresses.

Example 14 is the method of any of the Examples 10 through 13, further comprising connecting the output port of one of a final of at least two oscilloscopes to the input port of the master oscilloscope to form a closed series of oscilloscopes.

Example 15 is the method of Example 14, further comprising sending encoded acquisition control queries to at least one other oscilloscope.

Example 16 is the method of any of Examples 10 through 15, wherein synchronizing comprises using a phase-locked loop on the at least one slave oscilloscope.

Example 17 is the method of Example 16, where the encoding minimizes energy within the phase-locked loop bandwidth.

Example 18 is the method of either of Examples 17 or 18, further comprising setting a bandwidth of the phase-locked loop to minimize jitter between the oscilloscopes.

Example 19 is the method of any of the Examples 10 through 18, further comprising performing calibration of a designated oscilloscope of the at least two oscilloscopes, by: connecting a cable from an output port of the designated oscilloscope to an input port of the designated oscilloscope; comparing an edge on a signal on the output port to an edge on the input port; and measuring a delay for the cable.

Example 20 is the method of Example 19, further comprising using the measured cable delay to adjust signals when the designated oscilloscope is connected in series with at least one other oscilloscope of the at least two oscilloscopes.

Although specific embodiments have been illustrated and described for purposes of illustration, it will be understood that various modifications may be made without departing from the spirit and scope of the disclosure. Accordingly, the invention should not be limited except as by the appended claims.

We claim:

1. A system, comprising:
   a plurality of test and measurement instruments, each test and measurement instrument having an output port and an input port;
   a cable connecting the output port of an initial test and measurement instrument of the plurality of test and measurement instruments to the input port of a second test and measurement instrument of the plurality of test and measurement instruments;
   the initial test and measurement instrument having a processing element to generate a master clock;
   the second test and measurement instrument having a processing element including a phase-locked loop to lock a slave clock to the master clock, wherein
   the processing element of one of the test and measurement instruments executes code to cause the processing element to manipulate one of the clocks to pass information to another of the plurality of test and measurement instruments.

2. The system as claimed in claim 1, wherein the plurality of test and measurement instruments further comprises one or more additional test and measurement instruments connected in a series with the initial test and measurement instrument and the second test and measurement instrument, each additional test and measurement instrument having a cable connecting the output port of a previous test and measurement instrument in the series to the input port of a current test and measurement instrument in the series, wherein the second test and measurement instrument is a previous test and measurement instrument in the series.

3. The system as claimed in claim 1, wherein the plurality of test and measurement instruments comprises a final test and measurement instrument having a cable connecting the output port of the final test and measurement instrument and the input port of the initial test and measurement instrument to form a closed loop through the plurality of test and measurement instruments.

4. The system as claimed in claim 1, wherein the system is implemented using legacy hardware.

5. The system as claimed in claim 1, wherein the cable connecting the output port of the initial test and measurement instrument to the input port of one other of the plurality of test and measurement instruments connects to the input port of the other test and measurement instrument through a hub.

6. The system as claimed in claim 5, wherein the hub has one input port and multiple output ports to connect to the input ports of multiple test and measurement instruments.

7. The system as claimed in claim 5, wherein the hub is connected to multiple test and measurement instruments and at least one of the multiple test and measurement instruments has a cable connected to an output port and connected to an input port of one other test and measurement instrument that is not connected to the hub or any other test and measurement instruments.

8. The system as claimed in claim 1, wherein the cable conveys the manipulated clock.

9. The system as claimed in claim 1, wherein at least a portion of the processing element is implemented in a field-programmable gate array.

10. A method of synchronizing a system comprising at least two test and measurement instruments including a master test and measurement instrument and at least one slave test and measurement instrument, the method comprising:
    connecting the at least two test and measurement instruments together using output ports and input ports of the at least two test and measurement instruments and at least one cable;
    sending a master clock from the master test and measurement instrument to at least one slave test and measurement instrument;
    synchronizing a slave clock of the at least one slave test and measurement instrument to the master clock;
    modulating a run clock at a first test and measurement instrument of the at least two test and measurement instruments to encode information to be sent to another of the at least two test and measurement instruments;
    receiving the modulated run clock at a second test and measurement instrument of the at least two test and measurement instruments; and
    decoding the information at the second test and measurement instrument of the at least two test and measurement instruments.

11. The method as claimed in claim 10, wherein modulating the run clock comprises encoding information by altering the amplitude of one or more pulses of the run clock.

12. The method as claimed in claim 10, wherein modulating the run clock comprises encoding information by altering the intervals between a first edge polarity of the run clock and a second edge polarity of the run clock.

13. The method as claimed in claim 10, wherein decoding the information at the second test and measurement instrument causes the second test and measurement instrument to perform an action.

14. The method as claimed in claim 13, wherein the encoded information comprises trigger information, and the action comprises recognizing a trigger event at the second test and measurement instrument.

15. The method as claimed in claim 13, wherein the encoded information comprises an acquisition control message, and the action comprises causing the second test and measurement instrument to either start a new acquisition or stop a running acquisition without triggering.

16. The method as claimed in claim 13, wherein the encoded information comprises a query message, and the action comprises causing the second test and measurement instrument to respond to the query message.

17. The method as claimed in claim 16, wherein causing the second test and measurement instrument to respond to the query message further comprises modulating a run clock at the second test and measurement instrument to encode a response to the query.

18. The method as claimed in claim 13, wherein the encoded information comprises an auto-discover message, and the action comprises causing the second test and measurement instrument to identify itself to the system.

19. The method as claimed in claim 18, wherein causing the second test and measurement instrument to identify itself to the system comprises modulating a run clock at the second test and measurement instrument to encode a device addresses.

20. The method as claimed in claim 18, wherein the action further comprises causing the second test and measurement instrument to report an accumulated delay.

* * * * *